Figure 1:
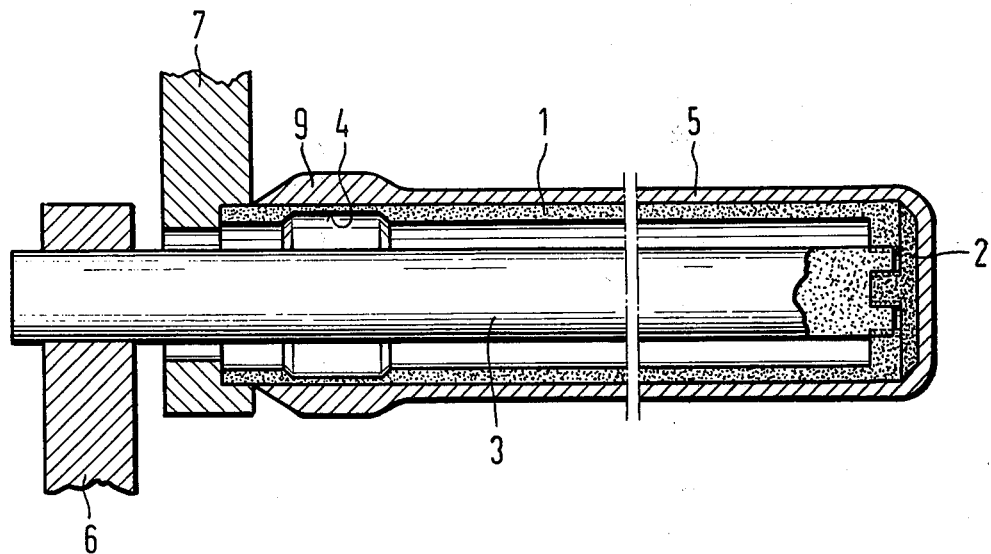

United States Patent [19]
Dietze et al.

[11] 3,979,490
[45] Sept. 7, 1976

[54] METHOD FOR THE MANUFACTURE OF TUBULAR BODIES OF SEMICONDUCTOR MATERIAL

[75] Inventors: Wolfgang Dietze, Munich; Konrad Reuschel, Vaterstetten; Andreas Kasper, Garching-Hochbruck, all of Germany

[73] Assignee: Siemens Aktiengesellschaft, Berlin, Munich, Erlangen, Germany

[22] Filed: Nov. 19, 1973

[21] Appl. No.: 417,380

Related U.S. Application Data
[63] Continuation of Ser. No. 205,492, Dec. 7, 1971, abandoned.

[30] Foreign Application Priority Data
Dec. 9, 1970   Germany.......................... 2060651

[52] U.S. Cl................................... 264/81; 427/91
[51] Int. Cl.².................. B01J 17/30; B01J 17/32
[58] Field of Search.................. 264/299, 81, 82; 423/348; 117/200, 106; 427/99, 102, 93, 94, 91, 124, 51

[56] References Cited
UNITED STATES PATENTS

| | | |
|---|---|---|
| 2,999,735 | 9/1961 | Reuschel............................ 117/200 |
| 3,014,791 | 12/1961 | Benzing et al...................... 423/348 |
| 3,139,363 | 6/1964 | Baldrey................................. 264/81 |
| 3,438,810 | 4/1969 | Benedict et al...................... 264/81 |
| 3,576,932 | 4/1971 | Biddulph.............................. 264/81 |
| 3,620,827 | 11/1971 | Emmasingel........................ 264/81 |
| 3,686,378 | 8/1972 | Dietze.................................. 264/81 |
| 3,746,496 | 7/1973 | Dietze et al......................... 264/81 |
| 3,747,559 | 7/1973 | Dietze.................................. 264/81 |
| 3,751,539 | 8/1973 | Reuschel et al..................... 264/81 |

*Primary Examiner*—Donald J. Arnold
*Attorney, Agent, or Firm*—Herbert L. Lerner

[57] ABSTRACT

For the manufacture of tubular bodies of semiconductor material, particularly of silicon, by the precipitation of a layer in the form of a hollow cylinder on a rod or tube-shaped, electrically heated carrier in a reaction gas suitable for the deposition of the semiconductor in question, with subsequent separation of the semiconductor layer from the carrier, the carrier is differentially heated in such a manner that the generated hollow-cylinder layer is given an annular, bead-like reinforcement; the separation of the tube obtained into parts is achieved by a cut made within the reinforcement.

9 Claims, 2 Drawing Figures

METHOD FOR THE MANUFACTURE OF TUBULAR BODIES OF SEMICONDUCTOR MATERIAL

This is a continuation of application Ser. No. 205,492, filed Dec. 7, 1971 and now abandoned.

The present invention concerns a method for the manufacture of tubular bodies of semiconductor material, particularly of silicon, in which a rod or tube-shaped carrier of carbon, particularly of graphite, is heated in a reaction gas suitable for the precipitation of the particular semiconductor, so that the surface of the carrier is coated with a layer of the semiconductor which, after removal of the carrier, constitutes the desired tube.

The tubular bodies produced in this manner serve particularly as processing vessels for the manufacture of semiconductor components, especially in the manufacture of epitaxial layers through a transport reaction or as a doping vessel. To this end, the tube which is arranged inside a suitable second reaction or processing vessel, is heated together with the semiconductor crystals which are disposed in its interior and are to be processed into the semiconductor devices to be manufactured, to the required temperature so that doping material is released from the wall of the tube and/or a gaseous semiconductor compound which, in turn, effects the doping of the semiconductor wafers and/or the precipitation of an epitaxial layer on them. For this purpose, there is either a suitable treatment gas, for instance, an inert gas or hydrogen or hydrochloric acid, admitted into the outer reaction vessel, which, preferably, consists of quartz, or the processing vessel is evacuated.

The requirement for such semiconductor tubes would seem to be relatively large, in the planned fabrication of semiconductors. The economical manufacture of these tubes is, therefore, of interest. This can be accomplished, if one starts out with correspondingly long carriers and deposits, over their entire surface, the semiconductor layer which forms the desired tube. The latter must then be separated from the carrier, which is possible in different ways, among which is pulling the carrier off the layer, as long as the carrier consists of carbon, particularly of graphite, and the precipitation temperature is not too high, for instance, in the case of silicon, the precipitation temperature should be less than 1,200°C. In this connection, it is advantageous if, according to U.S. Pat. application Ser. No. 113,286, filed Feb. 8, 1971, a tubular carrier is used through which a coolant, for instance, hydrogen flows during the precipitation process.

It is an object of the present invention to provide the finished semiconductor tube with annular bead-like reinforcements, particularly at its ends. In the interest of mechanical stability, such reinforcement is also desirable at points at which a longer tube is to be cut into two shorter tubes.

According to the invention, the cylindrical surface of the carrier is, therefore, heated along at least one annular zone, in contrast to the remaining surface of the carrier, in such a manner that during precipitation, an annular reinforcement of the tube formed on the surface of the carrier, is spontaneously generated along the annular zone.

Precipitation in which layers of different thicknesses are spontaneously generated at the points in question, based upon differential heating of adjacent areas of the carrier surface, is possible since the precipitation velocity from a given reaction gas is generally a temperature dependent quantity. At least there exists a temperature range in which the precipitation velocity also increases as the temperature increases. In many cases, particularly when silicon halides or germanium halides are used as the active components of the reaction gas, there is also a range in which the precipitation velocity decreases with the increasing temperature. If now $T_o$ is the normal temperature of the carrier surface; $T_z$ the temperature of the ring zone and $v(T_o)$ and $v(T_z)$ are the corresponding precipitation velocities, one must, according to the present invention, make sure that the difference $v(T_z)-v(T_o)$ is positive.

In order to be able to separate more easily the layers constituting the tubes from the carrier which consists of carbon, particularly graphite, one selects in the case when silicon is used as the material from which the tubes are to be manufactured, a precipitation temperature below 1,200°C. Under these conditions, the derivative of the precipitation velocity with respect to the temperature is positive for the case of reaction gases which, in the case of silicon deposition, usually consist of $H_2$ and $SiHCl_3$ or $H_2$ and $SiCl_4$, respectively. The temperature $T_z$ then must be chosen above the temperature $T_o$. A temperature difference of about 50°C between the ring zone and the remaining carrier surface at lower temperature is desirable. These temperatures can readily be adjusted and monitored, for instance, with an optical pyrometer or an infrared cell. For instance, in the case of deposition of silicon from a reaction gas of 10 mol-% $SiHCl_3$ (remainder hydrogen) a temperature $T_o$ of 1,120°C, and for $T_z$ a temperature of 1,180°C, are adjusted. In the case that $SiCl_4$ with hydrogen is used as the reaction gas, similar temperatures can be used also. In that case, it is desirable that the reaction gas contain 5 – 6 mol-% $SiCl_4$.

However, the case must also be considered where the ring zone on the carrier surface has a lower temperature than the remaining carrier surface while still generating a spontaneous reinforcement of the semiconductor tube at the ring zone. This is always the case if the derivative of the precipitation velocity with respect to temperature has a negative value in the temperature range of the carrier surface.

For the now following discussion, it is assumed that this derivative has a positive value.

A precipitation device suitable to carry out the invention can be designed in two ways:

1. with a tubular carrier, which is heated by the direct passage of current (DC or low frequency) an annular thinning of its wall is sufficient. This thinning, automatically, has the effect that the carrier heats up more at this point than do the parts of the carrier wall which have normal thickness. If one now uses a reaction gas, which precipitates the silicon or other semiconductor material more rapidly at the higher temperature of the ring zone than at the colder parts of the tubular carrier which has the normal wall thickness, the tube being formed will, without further action, attain a greater wall thickness at the ring zone;

2. if extraneous heating is used, for example, a heating coil disposed within a tubular carrier or a heating helix or induction coil concentrically surrounding the tubular carrier from the outside, the radiated energy can be concentrated more strongly onto the desired annular zones of the carrier surface than on the parts having normal thickness. For instance, the above-mentioned coil or helix is wound more closely immediately above, or below, the ring zone which is to be heated more strongly, so that in operation the temperature becomes higher there than that of the remaining carrier surface.

Figure 2:
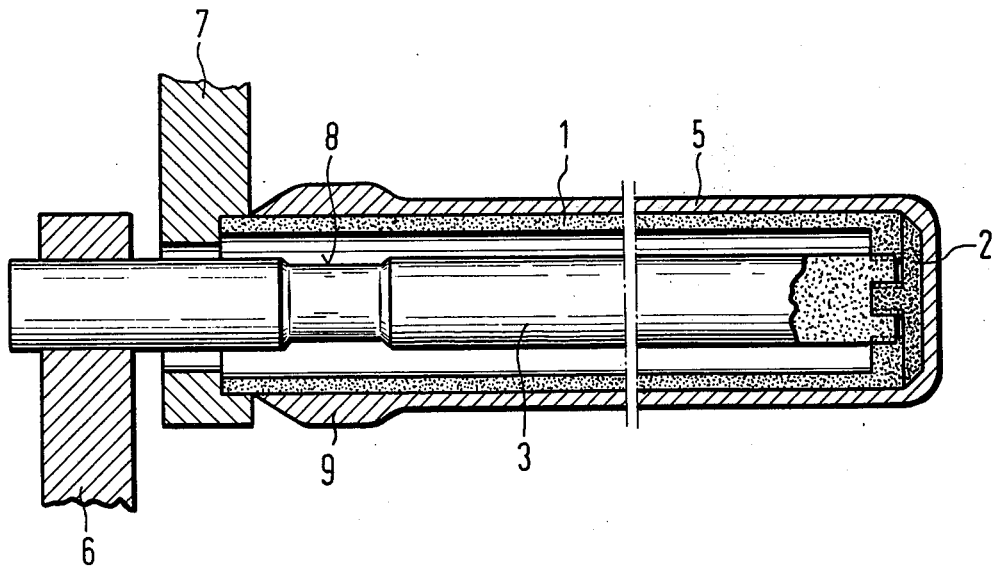

Although the invention is further illustrated and described herein, it is nevertheless not intended to be limited to the details shown, since various modifications may be made therein, within the scope and the range of the claims. The invention, however, together with additional objects and advantages will be best understood from the following description and in connection with the accompanying Drawing, in which:

FIG. 1, schematically, illustrates case 1; and
FIG. 2, schematically, illustrates case 2.

The embodiment shown in FIG. 1, corresponds to case 1. Compared to the other possibility, this has the advantage of better definition of the ring zone. Important for this embodiment is the contacting of the tubular carrier 1. This is achieved at the one end by an annular electrode 7, for instance, of graphite or metal, which makes contact with the carrier and which seals the carrier 1 like a cover at the other end via a bridge 2 of conducting material, particularly also of graphite. This cover constitutes the conducting connection with a coaxial second conductor 3 which is arranged inside the carrier 1 and concentrically with it. The inner conductor 3 is insulated from and led through the tubular eletrode 7. This conductor 3 is provided with a contact by an electrode 6, for instance, of metal. This arrangement is disposed in a reaction vessel (not shown), for instance, in such a manner that the carrier is attached in or at the wall of the reaction space by electrode 7, so that the carrier 1 extends into the reaction space like a finger.

The contact design for the tubular carrier, as shown in FIGS. 1 and 2, assures a particularly uniform temperature of the carrier surface with respect to the azimuth. With the exception of the above-mentioned ring zones, uniformity of the temperature in the axial direction is also assured.

In accordance with the invention, the wall of the tubular carrier 1, which otherwise has homogeneous wall thickness, has at least one annular region of reduced wall thickness. This is located, preferably, where the end of the tube is to be precipitated. The annular zone of reduced wall thickness of the carrier 1 is seen in FIG. 1, at 4, where the carrier heats up most if it is heated by DC or AC current directly flowing through it. If a reaction gas of the type is used, in which the precipitation velocity is greater at the more highly heated part 4 of the carrier wall than at the remaining parts of the carrier surface, the precipitating semiconductor layer 5 acquires spontaneously a bead-like reinforced portion 9 on the part 4. With a suitable design of the cover-like bridge 2, the latter heats also up to the extent that the deposit 5 extends also over the end surface of the finger formed by the carrier 1 and the bridge 2. The produced tube thus has the form of a cylindrical beaker. The deposition of an annular bead corresponding to the bead 9 at other points of the carrier surface, for instance, in the vicinity of the cover 2, is recommended particularly if at these points the tube is to be cut apart.

When using silicon as the semiconductor material, it is advisable to adjust absolute values of the difference $T_z - T_o$ to about 15°–150°C. In the case exemplified by FIGS. 1 and 2, the normal wall thickness of the carrier 1 is about 2 to 5 mm, the spacing from the inner conductor 3 approximately 2 – 10 mm. The extent of the constriction 8 or the reduction of the wall thickness at the point 4, respectively, depends on the desired temperature difference between $T_z$ and $T_o$. It should further be observed, that the corresponding temperature difference between the ring zone at the precipitation surface and the remaining carrier surface can also be obtained by a bead-like reinforcement of the carrier (this leads to a local reduction of the temperature) or of the inner conductor 3 (also leads to a local reduction of the temperature). Here one must see to it that the deposition velocity becomes smaller with increasing temperature of the carrier surface.

In the arrangement shown in FIG. 2, the tubular carrier 1 also forms the outer conductor of a coaxial line system, except that here the ring zone 4 of reduced wall thickness of the carrier 1 is omitted. Instead, an annular constriction 8 of the inner conductor 3 is provided. If current flows (DC or low frequency AC) it heats up more strongly than the remaining, uniformly cylindrical part of the inner conductor 3. If the distance of the inner conductor 3 from the carrier 1, as well as the wall thickness of the carrier 1, are so small that the part of the outer carrier surface directly opposite the constriction 8 becomes appreciably hotter than the remaining surface of the carrier 1, one also obtains at the precipitation surface of the carrier 1 a ring zone of increased temperature. With a suitably matched selection of the reaction gas, an annular bead-like reinforcement 9 of the tubular deposition 5 is also formed there.

An insulating coolant, particularly a stream of hydrogen or inert gas, can flow through the tubular carrier 1 during the deposition process. To this end, the annular electrode 7 in the arrangement shown in FIGS. 1 and 2 can at the same time serve as the entrance point for the coolant into the space between the two conductors 1 and 3. In order to bring back the coolant from the space between the two conductors, the inner conductor 3 can also be made in the shape of a ring. It then has immediately in the vicinity of the terminating cover 2 openings which are practically distributed symmetrically, through which the cooling gas flowing between the two conductors 1 and 3 can get into the interior of the carrier 3 and can be removed further from there. If a cooling gas which is harmless to the reaction gas is used, the cooling gas can, instead, be admitted into the reaction space through openings arranged in the cover 2 and then flows out with the spent reaction gas.

As already mentioned, one of the main fields of application of the semiconductor tubes produced on the basis of the process according to the invention, is the use as processing vessels in the manufacture of semiconductor devices. For this purpose, the semiconductor loaded with the semiconductor bodies to be heated, in particular semiconductor wafers, is arranged in a further processing vessel in which then the required processing atmosphere or vacuum is generated. In this environment, the tube is then heated to the process temperature, for instance, inductively, or also by using annular electrode terminals which are attached to the reinforced tube ends.

If the carrier wall is uniform at the described annular constrictions or bulges, at which the reinforced tube parts are to be precipitated, and if furthermore the carrier is exactly cylindrical there, the deposited tube will also be uniform and cylindrical at the reinforcements generated. This property permits it to connect a supply line and, if desired, also a discharge line for processing gases directly to the semiconductor tube; the bead-like reinforced part at the ends of the semiconductor can, if desired, be provided with a ground joint and placed directly on a quartz tube serving as the feed or discharge line, or the latter is fitted onto the silicon tube.

If the processing tube consists of a sufficiently resistance semiconductor material, for instance silicon or silicon carbide, the outer processing vessel can be omitted altogether. In this case, it is recommended to provide the semiconductor tube, before placing it into operation, with a protective covering of a thermally and chemically stable material which has a thermal coefficient of expansion similar to that of silicon. As such a material, for instance, tantalum, molybdenum, tungsten, silicon carbide or $SiO_2$ can be considered. Layers of these substances can be applied either by pyrolytic precipitation from the gaseous phase or by electrolytic deposition on the outer surface of the silicon tube. Possible contamination of the semiconductor wafers to be treated in the interior of the silicon tubes due to the coating material can be counteracted by suitable thickness of the tube, if this a danger at all.

What is claimed is:

1. Method of producing a tubular shaped body of silicon semiconductor material and concurrently provide said tubular shaped body with an annular reinforcement, the steps of: heating by electrical means a rod or tube-shaped carrier body of carbon in the presence of reaction gases selected from the groups consisting of $H_2$ and $SiHCl_3$, or $H_2$ and $SiCl_4$, for the precipitation of said semiconductor material to temperature sufficient to cause precipitation out of said reaction gases of a layer of semiconductor material on the surface of the carrier body; simultaneously therewith, heating by electrical means, a surface of at least one annular zone, disposed about the periphery of the carrier body to a temperature different to that of the remainder of the carrier body to cause more rapid precipitation out on the surface of said annular zone of the carrier body to form an annular reinforcement of greater wall thickness than the tubular shaped body; and separating the tubular shaped body of semiconductor having an annular reinforcement from the carrier body.

2. The method of claim 1, wherein the feature at least the ends of the tubular shaped body to be manufactured, are reinforced.

3. The method of claim 1, wherein the reinforcement is at an intended separation point.

4. The method of claim 1, wherein the composition of the reaction gases and the temperatures of the carrier surface are adjusted so that a further increase in temperature at the carrier surface causes an increase in the precipitation velocity.

5. The method of claim 1, wherein an insulating coolant of hydrogen gas, during the precipitation operation, flows through the tubular carrier.

6. Method as claimed in claim 1, including the steps of: heating the carrier body provided with an electrical conductor disposed coaxially therein, said conductor having a different current conducting cross-sectional area to that of the remainder of the conductor at a surface opposite to the annular zone of the carrier body.

7. Method as claimed in claim 1, including the steps of: heating the carrier body provided with a different cross-sectional area to that of the remainder of the carrier body and disposed opposite to the surface defining the annular zone.

8. The method of claim 2, wherein a joint is ground at least one of the reinforced ends and a tube for feeding a gas into or discharging a gas from the tubular shaped body is connected to the tubular shaped body at said joint.

9. Method of producing a tubular shaped body of silicon semiconductor material and concurrently provide said tubular shaped body with an annular reinforcement, the steps of: heating a rod or tube-shaped carrier body of carbon in the presence of reaction gases selected from the group consisting of $H_2$ and $SiHCl_3$ or $H_2$ and $SiCl_4$ for the precipitation of said semiconductor material to a temperature sufficient to cause precipitation out of said reaction gases of a layer of semiconductor material on the surface of the carrier body, simultaneously therewith, heating a surface of at least one annular zone, disposed about the periphery of the carrier body to a temperature different to that of the remainder of the carrier body to cause more rapid precipitation out on the surface of said annular zone of the carrier body to form an annular reinforcement of greater wall thickness than the tubular body, said heating being effected by passage of an electric current from a single energy source through said carrier body.

* * * * *